United States Patent
Konno

(10) Patent No.: US 10,410,945 B2
(45) Date of Patent: Sep. 10, 2019

(54) SEMICONDUCTOR DEVICE

(71) Applicant: Hitachi, Ltd., Tokyo (JP)

(72) Inventor: Akitoyo Konno, Tokyo (JP)

(73) Assignee: HITACHI, LTD., Tokyo (JP)

( * ) Notice: Subject to any disclaimer, the term of this patent is extended or adjusted under 35 U.S.C. 154(b) by 81 days.

(21) Appl. No.: 15/554,706

(22) PCT Filed: Feb. 3, 2016

(86) PCT No.: PCT/JP2016/053121
§ 371 (c)(1),
(2) Date: Aug. 30, 2017

(87) PCT Pub. No.: WO2016/152258
PCT Pub. Date: Sep. 29, 2016

(65) Prior Publication Data
US 2018/0240728 A1    Aug. 23, 2018

(30) Foreign Application Priority Data

Mar. 23, 2015 (JP) .................. 2015-058918

(51) Int. Cl.
| | |
|---|---|
| *H01L 23/36* | (2006.01) |
| *H01L 23/48* | (2006.01) |
| *H01L 25/07* | (2006.01) |
| *H01L 25/18* | (2006.01) |
| *H01L 23/00* | (2006.01) |
| *H01L 23/373* | (2006.01) |

(52) U.S. Cl.
CPC .......... *H01L 23/36* (2013.01); *H01L 23/3735* (2013.01); *H01L 23/48* (2013.01);
(Continued)

(58) Field of Classification Search
CPC ..... H01L 23/367–3677; H01L 23/3735; H01L 24/37; H01L 24/40
See application file for complete search history.

(56) References Cited

U.S. PATENT DOCUMENTS

| | | |
|---|---|---|
| 2006/0192253 A1 | 8/2006 | Okumura et al. |
| 2010/0127383 A1 | 5/2010 | Oka et al. |

(Continued)

FOREIGN PATENT DOCUMENTS

| | | |
|---|---|---|
| EP | 2 544 228 A2 | 1/2013 |
| JP | 2002-176128 A | 6/2002 |

(Continued)

OTHER PUBLICATIONS

Extended European Search Report dated Oct. 19, 2018 in Application No. 16768161.8.

(Continued)

*Primary Examiner* — Daniel P Shook
(74) *Attorney, Agent, or Firm* — Foley & Lardner LLP

(57) ABSTRACT

Provided is a semiconductor device with high reliability. In order to solve the above problems, according to the present invention, the semiconductor device includes a heat dissipating substrate, an insulating substrate arranged on the heat dissipating substrate and having a wiring layer, a plurality of semiconductor elements arranged on the insulating substrate, a conductive block electrically connected to a front surface electrode of the semiconductor element, and a terminal electrode, in which the conductive block has a convex portion, and the convex portion is bonded to the insulating substrate.

14 Claims, 4 Drawing Sheets

(52) U.S. Cl.
CPC .............. *H01L 24/16* (2013.01); *H01L 24/37* (2013.01); *H01L 24/40* (2013.01); *H01L 25/07* (2013.01); *H01L 25/072* (2013.01); *H01L 25/18* (2013.01); *H01L 2224/32225* (2013.01); *H01L 2224/32245* (2013.01); *H01L 2224/33181* (2013.01); *H01L 2224/40225* (2013.01); *H01L 2224/48091* (2013.01); *H01L 2224/48227* (2013.01); *H01L 2224/73215* (2013.01); *H01L 2224/73265* (2013.01); *H01L 2224/92147* (2013.01); *H01L 2224/92247* (2013.01); *H01L 2924/00014* (2013.01); *H01L 2924/13091* (2013.01)

(56) References Cited

U.S. PATENT DOCUMENTS

2013/0093082 A1* 4/2013 Okumura .......... H01L 23/49827
257/737

| 2013/0119525 | A1 | 5/2013 | Tsuyuno et al. |
| 2013/0176682 | A1 | 7/2013 | Besendorfer et al. |
| 2015/0008570 | A1 | 1/2015 | Arai et al. |

FOREIGN PATENT DOCUMENTS

| JP | 2005-064441 A | 3/2005 |
| JP | 2006-237429 A | 9/2006 |
| JP | 2009-224529 A | 10/2009 |
| JP | 2010-129550 A | 6/2010 |
| JP | 2010-232369 A | 10/2010 |
| JP | 2014-022579 A | 2/2014 |
| JP | 2015-015270 A | 1/2015 |
| WO | WO-2012-014843 A1 | 2/2012 |

OTHER PUBLICATIONS

International Search Report with English translation and Written Opinion issued in corresponding application No. PCT/JP2016/053121 dated Apr. 26, 2016.

* cited by examiner

SEMICONDUCTOR DEVICE

TECHNICAL FIELD

The present invention relates to a semiconductor device.

BACKGROUND ART

A semiconductor device has a function of converting DC power supplied from a DC power supply into AC power to be supplied to an inductive load such as a motor or a function of converting AC power generated by a motor into DC power to be supplied to a DC power supply. In order to accomplish these conversion functions, the semiconductor device includes a semiconductor element having a switching function to perform power conversion from DC power to AC power or from AC power to DC power by repeating conduction operation and interruption operation, In a semiconductor device, an insulating substrate having a wiring pattern formed thereon is bonded on a heat dissipating substrate through solder, and a semiconductor element is mounted on the wiring pattern of the insulating substrate. The semiconductor element has electrodes on the front and back surfaces. The back surface electrode is connected to the wiring pattern on the insulating substrate, and the front surface electrode is connected to the wiring pattern on the insulating substrate through the wire. In high-power semiconductors used for railroads, a plurality of insulating substrates are mounted so as to cope with a large current.

In recent years, the current density of a semiconductor device has increased. In particular, since a semiconductor element using SiC (silicon carbide) have a higher operating temperature than Si (silicon), a larger current can flow in the semiconductor element. If the current density of the semiconductor device increases, the amount of current flowing in one semiconductor element increases, so that the amount of heat generation increases. There is a problem in that, due to thermal expansion and contraction accompanying the increase in heat generation, a bonding layer bonding the back surface electrode of the semiconductor element and the wiring pattern of the insulating substrate is deteriorated, or bonding reliability between the front surface electrode of the semiconductor element and the wire is deteriorated.

In addition, in the case where the area of a semiconductor device is required to be reduced and wires are applied to the bonding between the front surface electrode of the semiconductor element and the wiring on the insulating substrate, there is a problem in that, the region of the wiring pattern on the insulating substrate is not sufficient, a sufficient number of wires cannot be bonded. Therefore, the front surface electrode of the semiconductor element and the wiring pattern on the insulating substrate need to be bonded with plate-shaped lead electrodes.

PTL 1 discloses a semiconductor device configured to include a lead frame having a die pad mounting a power semiconductor element and an external lead terminal, a plate-shaped metal piece electrically connecting at least between an electrode of the power semiconductor element and an external lead terminal or between the electrode between the power semiconductor element and an electrode of a control element, and a sealing resin sealing the power semiconductor element, the control element, and the metal piece.

CITATION LIST

Patent Literature

PTL 1: Japanese Patent Application Laid-Open No. 2009-224529

SUMMARY OF INVENTION

Technical Problem

In the case of bonding a front surface electrode of a semiconductor element and a plate-shaped lead electrode, there is a problem in that large stress is applied due to a difference in thermal expansion coefficient, and thus, bonding reliability of the front surface electrode of the semiconductor element and the plate-shaped lead electrode is deteriorated.

Accordingly, the present invention is to improve bonding reliability of a lead electrode connected to a front surface electrode of a power semiconductor chip.

Solution to Problem

In order to solve the above problems, according to the present invention, there is provided a semiconductor device including: a heat dissipating substrate; an insulating substrate arranged on the heat dissipating substrate and having a wiring layer; a plurality of semiconductor elements arranged on the insulating substrate; a conductive block electrically connected to the front surface electrode of the semiconductor element, and a terminal electrode, in which the conductive block has a convex portion, and the convex portion is bonded to the insulating substrate.

Advantageous Effects of Invention

According to the present invention, it is possible to improve the reliability of a power semiconductor device.

DESCRIPTION OF EMBODIMENTS

Figure 1:
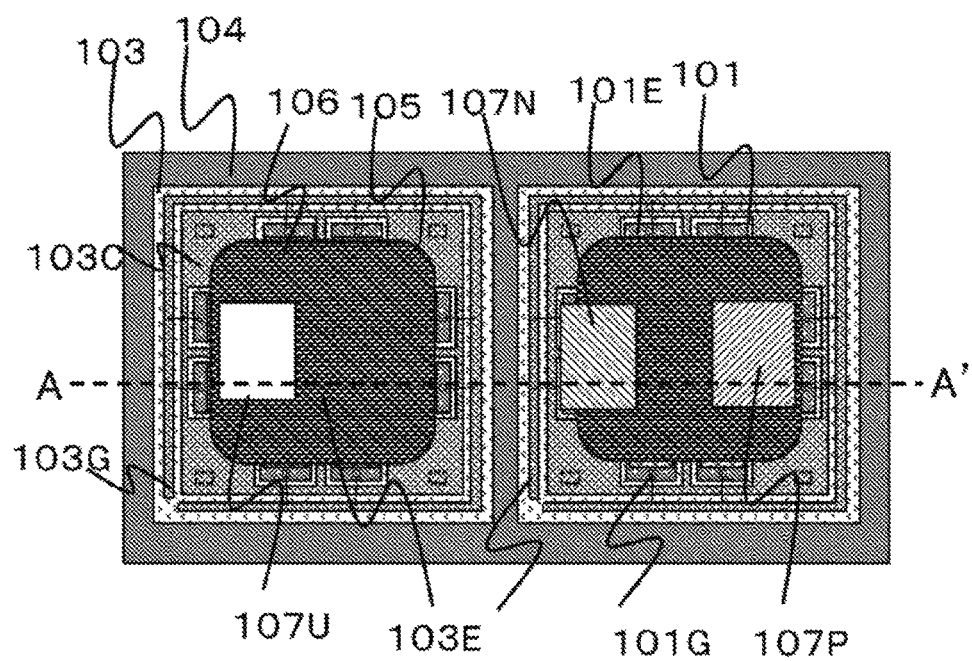
FIG. 1 is a top view of a semiconductor device according to an embodiment of the present invention.

Hereinafter, embodiments of the present invention will be described with reference to the drawings. FIG. 1 is a top view of a semiconductor device according to an embodiment of the present invention, and FIG. 2 illustrates a cross-sectional configuration taken along line A-A' of FIG. 1.

Figure 2:
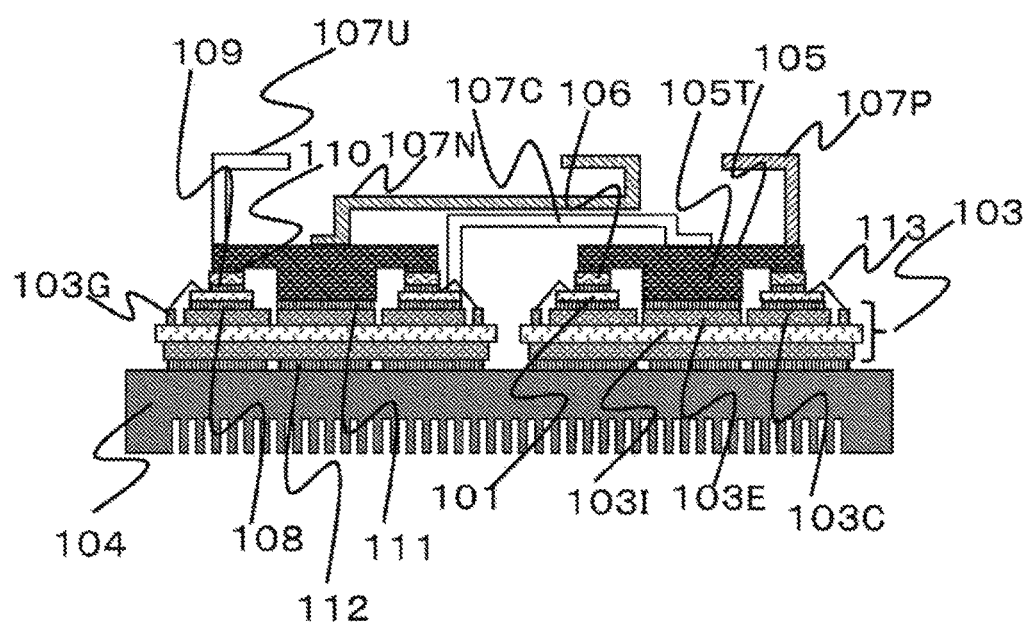
FIG. 2 is a cross-sectional view of the semiconductor device according to the embodiment of the present invention.

As illustrated in FIGS. 1 and 2, the semiconductor device according to this embodiment is configured to include a heat dissipating substrate 104, an insulating substrate 103 arranged on the heat dissipating substrate, a plurality of semiconductor elements 101 arranged on the insulating substrate, a conductive block electrically connected to a front surface electrode of the semiconductor device, a conductive plate 106, a terminal electrode 107, a bonding layer 108 bonding the semiconductor element and the insulating substrate, a bonding layer 109 bonding the conductive plate and the semiconductor element, a bonding layer 110 bonding the conductive plate and the conductive block, a bonding layer 111 bonding the conductive block and the insulating substrate, a bonding layer 112 bonding the insulating substrate and the heat dissipating substrate, and a gate wire 113.

In this embodiment, a MOSFET (metal-oxide-semiconductor field-effect transistor) is used as the semiconductor element.

The conductive block 105 bonded to the MOSFET 101 as a semiconductor element has a convex portion 105T. The convex portion 105T is bonded not to the MOSFET 101 but to the insulating substrate. As a result, since the heat capacity of the conductive block 105 increases, the temperature change of the MOSFET 101 can be moderated. By moderating the temperature change, the stress due to the temperature amplitude generated at each bonding interface is alleviated, so that it is possible to provide a semiconductor device with high reliability.

Furthermore, in this embodiment, the convex portion 105T of the conductive block is bonded on the source wiring pattern 103E which is the circuit wiring pattern of the same node as the source electrode 101E of the MOSFET 101 of the insulating substrate 103. As a result, the heat generated by the MOSFET 101 is dissipated to the insulating substrate 103 side through the conductive plate 106 and the conductive block 105. Namely, since the heat dissipating path is enlarged, the temperature of the MOSFET 101 further decreases, so that a semiconductor device with high reliability can be provided.

In addition, in order to improve the temperature reduction effect, it is preferable that the area of the bonding surface between the convex portion 105T of the conductive block and the insulating substrate 103 is larger than the area of at least one MOSFET 101. In addition, in order to further improve the temperature reduction effect, it is preferable that the interval between the convex portion 105T of the conductive block and the MOSFET 101 is 5 mm or less.

In this embodiment, the conductive block 105 is bonded to the MOSFET 101 through the conductive plate 106. By mounting the conductive plate 106, it is possible to increase the thickness of the convex portion 105T of the conductive block.

It is preferable that the thermal expansion coefficient of the conductive plate 106 is larger than the thermal expansion coefficient of the MOSFET 101 and smaller than the thermal expansion coefficient of the conductive block 105. As a result, distortion due to thermal expansion and contraction at each bonding interface is reduced, so that a semiconductor device with high reliability can be provided.

The conductive plate is required to have a role of alleviating thermal stress due to a difference in thermal expansion coefficient between the semiconductor element and the wiring member and a role of dissipating heat from the semiconductor element. As the conductive plate, it is preferable to use a material having a thermal expansion coefficient between the semiconductor element and the wiring member and having a thermal conductivity of 100 W/mK or more.

In addition, in this embodiment, the conductive block and the semiconductor element are bonded through the conductive plate. However, the conductive plate may not be used.

Figure 3:
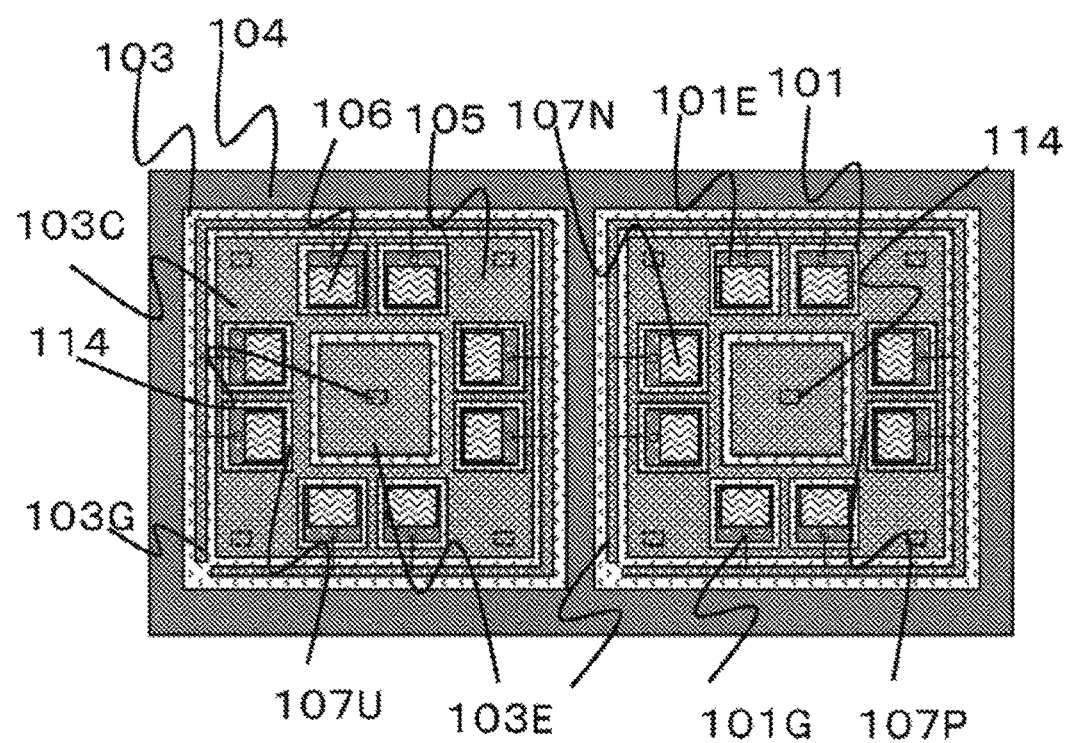
FIG. 3 is a top view of the semiconductor device according to the embodiment of the present invention.

It is preferable that a plurality of the MOSFETs (semiconductor elements) 101 are arranged so that the distances from the center of the conductive block to the semiconductor elements are substantially equally spaced. FIG. 3 illustrates a view in which the conductive block and the terminal electrode are omitted from FIG. 1. As illustrated in FIG. 3, by arranging a plurality of the semiconductor elements in a ring shape, the distances from the center of the conductive block to the semiconductors can be substantially equally spaced.

The current flowing through each MOSFET 101 is concentrated on an N-terminal electrode 107N and an inter-substrate relay terminal electrode 107C through the conductive plate 106 and the conductive block 105. Herein, in the case where the coefficient of induction of the current path before being concentrated on the N-terminal electrode 107N and the inter-substrate relay terminal electrode 107C is not uniform, the current flowing through each MOSFET 101 during a switching transient period is not uniform. As a result, for example, current is concentrated on a specific MOSFET 101, there is a problem in that the heat generated from the MOSFET 101 becomes larger than that of the other MOSFETs 101 and the MOSFET may be broken. Therefore, in this embodiment, the N-terminal electrode 107N and the inter-substrate relay terminal electrode 107C are bonded to the convex portion 105T of the conductive block, respectively, and eight MOSFETs 101 are connected to the bonding portion 114 at substantially equal distances. By equalizing the distances between the bonding portion 114 on which the current is concentrated and the eight MOSFETs 101, the coefficient of induction from each MOSFET 101 to the bonding portion 114 becomes equal, so that the currents flowing through the respective MOSFETs 101 can be equalized.

The MOSFET 101 is configured to include a drain electrode 101C on the back surface (the insulating substrate 103 side) and a source electrode 101E and a gate electrode 101G on the front surface (on the conductive block 105 side). The size of the semiconductor element varies with the specification of withstand voltage and the like. However, for example, a semiconductor element having a side length of 5 mm to 15 mm and a thickness of about 0.1 mm to 1.0 mm may be used. In this embodiment, a MOSFET is used as the semiconductor element. However, the semiconductor element is not limited to the MOSFET, any element capable of switching on/off current may be used. For example, an IGBT (Insulated Gate Bipolar Transistor) may be used as the switching element. In addition, in this embodiment, a body diode with the built-in MOSFET 101 is used as a free wheel diode. However, a mode where a free wheel diode is separately mounted may also be used.

The insulating substrate 103 is configured with an insulating layer 103I and a wiring layer arranged on the back surface (on the heat radiation base 104 side) and the front surface (on the semiconductor element side). As the insulating layer, aluminum nitride (AlN), silicon nitride (SiN), alumina (AlO), or the like having a high withstand voltage may be used.

The thickness of the insulating layer is set in a range of 0.1 mm to 1.5 mm in accordance with the insulating characteristics required for the semiconductor device. In this embodiment, AlN (aluminum nitride) having a thickness of about 0.6 mm is used for the insulating layer 103I. A solid pattern (wiring layer) of copper having a thickness of about 0.2 mm is brazed to the back surface of the insulating layer 103I. A wiring pattern (wiring layer) of Cu having a thickness of about 0.3 mm is brazed to the front surface of the insulating layer 103I. The wiring on the front surface side of the insulating substrate 103 is divided into a drain wiring pattern 103C, a source wiring pattern 103E, and a gate wiring 103G.

The drain electrode 101C of the MOSFET 101 is connected to the drain wiring pattern 103C on the insulating substrate 103 through the bonding layer 108. The source electrode 101E of the MOSFET 101 is connected to the conductive plate 106 through the bonding layer 109. The conductive plate 106 is connected to the conductive block 105 through the bonding layer 110. In addition, the conductive block 105 is connected to the source wiring pattern 103E of the insulating substrate 103 through the bonding layer 111.

The gate electrode 101G of the MOSFET 101 is connected to the gate wiring 103G on the insulating substrate 103 by the gate wire 113. The MOSFET 101 can control the resistance between the drain electrode 101C and the source electrode 101E by a potential difference between the gate electrode 101G and the source electrode 101E. The gate wiring 103G and the source wiring pattern 103E on the insulating substrate 103 are connected to an external gate driving circuit.

The insulating substrate 103 is connected to the heat dissipating substrate 104 through the bonding layer 112. The heat dissipating substrate 104 plays a role of efficiently transferring heat generated from the semiconductor element to the external cooler. As the material, copper or aluminum having a high thermal conductivity, an alloy thereof, a composite material (AlSiC) of aluminum and silicon carbide, or the like may be used. In this embodiment, the back surface side of the heat dissipating substrate is formed in a fin shape by using Cu. Since Cu has a high thermal conductivity and excellent workability, Cu has an advantage that Cu is relatively easy to provide a fin shape.

As the bonding layer, for example, a low-temperature sintered bonding material mainly made of a solder material, particles of metal, particles of metal oxide, or the like is used. As the solder material, for example, a solder containing tin, bismuth, zinc, gold, or the like as a main component may be used. As the particles of metal, nanoparticles of silver or copper coated with a cohesive protective material may be used. As the particles of metal oxide, metal oxides reducible at a low temperature are applicable. In the case where a sintered bonding material mainly made of particles of metal or particles of metal oxide is used, the bonding layer becomes a sintered metal layer. Among the sintered metal layers, sintered copper has higher melting point and higher heat resistance temperature than lead solders of the related art, so that a semiconductor device with high reliability can be provided. Since this semiconductor device is a lead-free device, the semiconductor device is also an environmental friendly device.

In the case where the difference in thermal expansion coefficient between the insulating layer of the insulating substrate and the heat dissipating substrate is large, it is preferable to improve the bonding reliability between the insulating substrate and the heat dissipating substrate in consideration of the thermal stress. In this embodiment, since AlN is used for the insulating layer and Cu is used for the heat dissipating substrate, the difference in thermal expansion coefficient between the insulating layer and the heat dissipating substrate is large. Therefore, in order to improve the bonding reliability between the insulating substrate and the heat dissipating substrate, the bonding layer 111 bonding the insulating substrate and the heat dissipating substrate is made of sintered copper. The heat dissipating substrate is also Cu, and the back side of the insulating substrate is a Cu pattern. Therefore, bonding of Cu and Cu can be formed. As a result, a highly reliable bonding interface can be obtained. Furthermore since the sintered body of Cu has a high melting point, the heat resistant temperature can be increased. The bonding layer 111 bonding the insulating substrate and the heat dissipating substrate is not limited to sintered copper. For example, even if a sintered body of silver is used, a highly reliable bonding interface can be obtained.

In addition, the semiconductor device also needs a resin casing covering the above-described structure, an external connection electrode, an internal filler for preventing discharge, and the like. As the resin casing, the external connection electrode, the internal filler and the like, those commonly used in a semiconductor device may be applied.

<Method of Manufacturing Semiconductor Device>

Next, a method of manufacturing the semiconductor device described in this embodiment will be described with reference to FIG. 4. First, a paste 115 in which fine particles of copper oxide are mixed with an organic solvent is coated on the insulating substrate 103 (step a). After that, the MOSFET 101 is mounted on the applied paste (step b), the same paste is also applied to the MOSFET 101 (step c), and the conductive plate 106 is mounted on the paste (step d). Furthermore, the same paste is applied also on the conductive plate 106 (step e), and the conductive block 105 is mounted (step f). Next, a paste in which particles of copper oxide are mixed with an organic solvent is applied on the heat dissipating substrate 104 (step g), the insulating substrate 103 where the mounting of the conductive block 105 is completed is mounted on the paste, and the conductive block 105 is heated at a temperature of 300° C. in a hydrogen atmosphere while pressurizing the upper surface of the conductive block 105, so that the fine particles of copper oxide in the paste are reduced and sintered to bond the respective interfaces (step h). After that, the gate wire 113 is wire-bonded (step i). By such a process, a plurality of bonding interfaces can be collectively bonded, so that it is possible to reduce the manufacturing cost.

However, the manufacturing process is not limited to the above-described process. For example, as illustrated in FIG. 4, sintering is performed at the stage where the conductive block 105 is mounted (step f), the gate wire 113 is wire-bonded (step g), the paste obtained by mixing particles of copper oxide in an organic solvent is applied on the heat dissipating substrate 104 (step h), the insulating substrate 103 where the bonding of the conductive block 105 is completed is mounted on the paste (step i), and the paste between the insulating substrate 103 and the heat dissipating substrate 104 is sintered.

Figure 4:
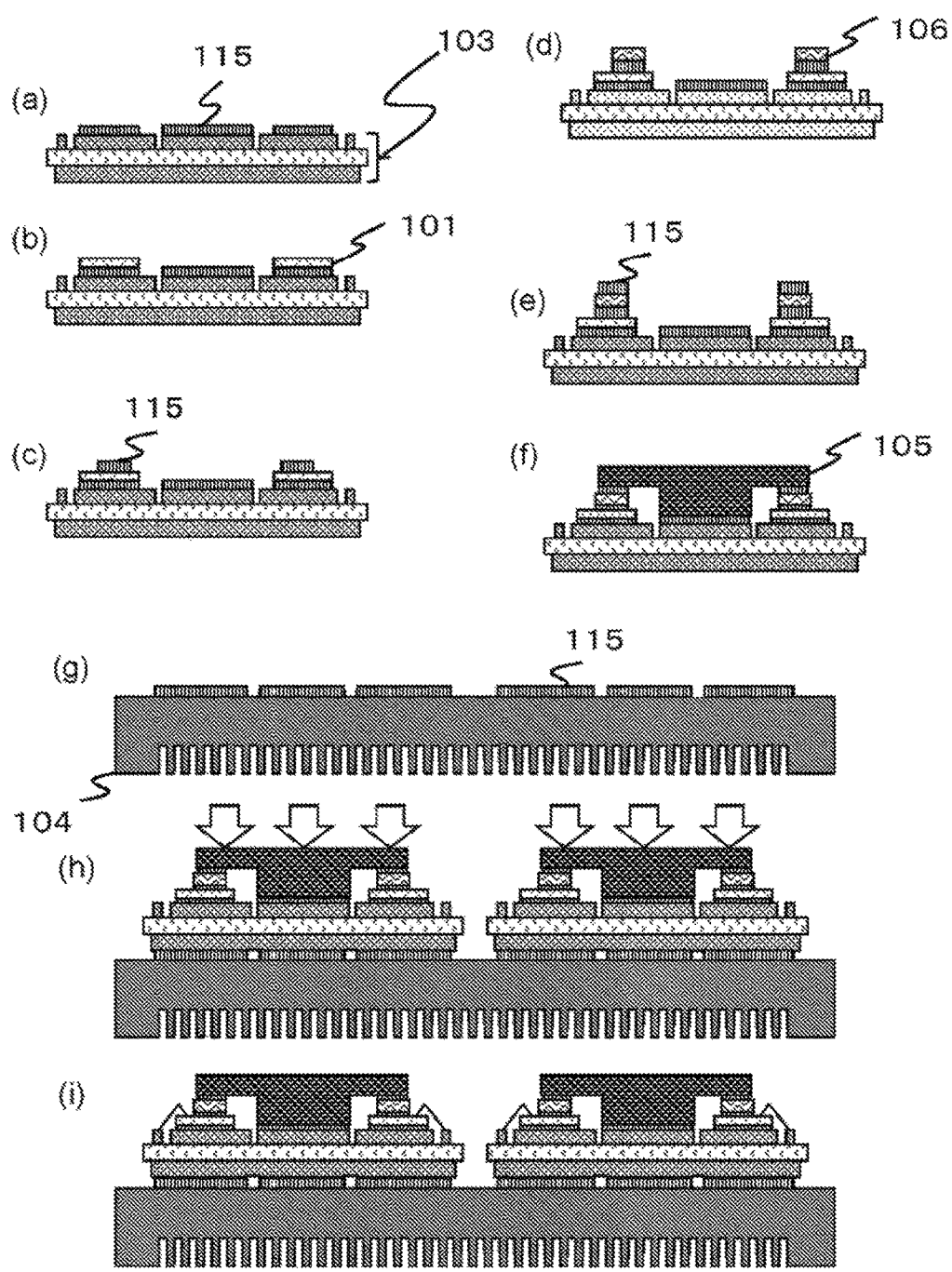
FIG. 4 is a view illustrating a bonding process of the semiconductor device according to the embodiment of the present invention.
Figure 5:
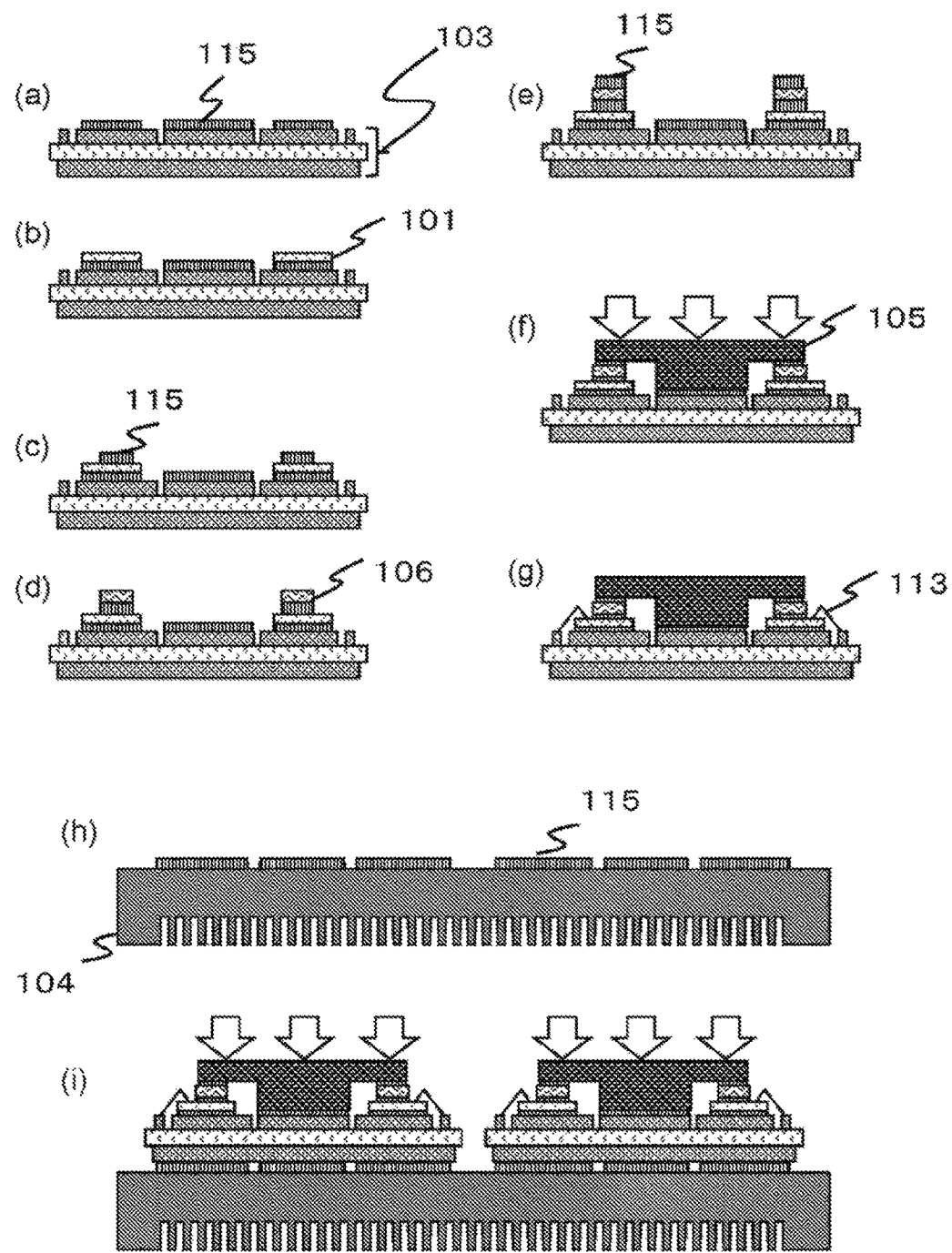
FIG. 5 is a view illustrating a bonding process of the semiconductor device according to the embodiment of the present invention.

In addition, in the case where a paste is applied on the upper surface of the MOSFET 101 and the upper surface of the conductive plate 106 in advance, the steps c and e illustrated in FIGS. 4 and 5 may be omitted.

In the step g illustrated in FIG. 4 or the step h illustrated in FIG. 5, instead of applying the paste over the entire area corresponding to the insulating substrate 103, the paste may be applied intermittently. Therefore, hydrogen as a reducing gas intrudes into the gap between the paste applied regions, and thus, the reduction reaction can be facilitated. As a result, the bonding reliability is improved.

REFERENCE SIGNS LIST

101 MOSFET
101C drain electrode
101E source electrode 101G gate electrode
103 insulating substrate
103I insulating layer
103C drain wiring pattern
103E source wiring pattern
103G gate wiring
104 heat dissipating substrate
105 conductive block
105T conductive block convex portion
106 conductive plate
107 terminal electrode
108 bonding layer bonding semiconductor element and insulating substrate
109 bonding layer bonding conductive plate and semiconductor element
110 bonding layer bonding conductive plate and conductive block
111 bonding layer bonding conductive block and semiconductor element
112 bonding layer bonding insulating substrate and heat dissipating substrate
113 gate wire
115 copper oxide paste

The invention claimed is:

1. A semiconductor device comprising:
   a terminal electrode;
   a heat dissipating substrate;
   an insulating substrate arranged on the heat dissipating substrate and including a wiring layer;
   a plurality of semiconductor switching elements arranged on the insulating substrate; and
   a conductive block electrically connected to a front surface electrode of the semiconductor switching element,
   wherein the conductive block has a convex portion,
   wherein the convex portion is bonded to the insulating substrate,
   wherein the conductive block is bonded to each of the plurality of semiconductor switching elements, and
   wherein the plurality of semiconductor switching elements are arranged to be substantially equally spaced with respect to a bonding portion between the convex portion of the conductive block and the terminal electrode.

2. The semiconductor device according to claim 1, wherein the convex portion is bonded on a wiring layer of the same node as the front surface electrode bonded to the conductive block.

3. The semiconductor device according to claim 1, wherein an area of a bonding surface between the conductive block and the insulating substrate is larger than an area of the semiconductor switching element.

4. The semiconductor device according to claim 1, wherein a distance between the convex portion and the semiconductor switching element is 5 mm or less.

5. The semiconductor device according to claim 1, wherein the conductive block is bonded to a front surface electrode of the semiconductor switching element through a conductive plate.

6. The semiconductor device according to claim 5, wherein a thermal expansion coefficient of the conductive plate is larger than a thermal expansion coefficient of the semiconductor switching element and smaller than a thermal expansion coefficient of the conductive block.

7. The semiconductor device according to claim 5, wherein at least one of the front surface electrode of the semiconductor switching element and the conductive block, the conductive block and the wiring layer of the insulating substrate, the front surface electrode of the semiconductor switching element and the conductive plate, and the wiring layer of the insulating substrate and the conductive plate is bonded through a sintered metal layer.

8. The semiconductor device according to claim 1, wherein the insulating substrate and the heat dissipating substrate are bonded through a sintered metal layer.

9. The semiconductor device according to claim 8, wherein the sintered metal layer contains copper.

10. The semiconductor device according to claim 8, wherein the insulating substrate and the heat dissipating substrate are intermittently bonded by a sintered metal body.

11. The semiconductor device according to claim 1, wherein at least one of the front surface electrode of the semiconductor switching element and the conductive block, and the conductive block and the wiring layer of the insulating substrate is bonded through a sintered metal layer.

12. The semiconductor device according to claim 1, wherein the heat dissipating substrate is made of copper.

13. The semiconductor device according to claim 12, wherein the heat dissipating substrate is formed in a fin shape.

14. The semiconductor device according to claim 1, wherein the plurality of semiconductor switching elements include three or more semiconductor switching elements that are arranged in a ring shape.

* * * * *